(12) United States Patent  (10) Patent No.: US 8,963,311 B2
Zhao et al.  (45) Date of Patent: Feb. 24, 2015

(54) POP STRUCTURE WITH ELECTRICALLY INSULATING MATERIAL BETWEEN PACKAGES

(71) Applicant: Apple Inc., Cupertino, CA (US)

(72) Inventors: Jie-Hua Zhao, Cupertino, CA (US); Yizhang Yang, Sunnydale, CA (US); Jun Zhai, San Jose, CA (US); Chih-Ming Chung, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 155 days.

(21) Appl. No.: 13/627,905

(22) Filed: Sep. 26, 2012

(65) Prior Publication Data

US 2014/0084487 A1 Mar. 27, 2014

(51) Int. Cl.
H01L 23/02 (2006.01)
H01L 23/48 (2006.01)

(52) U.S. Cl.
USPC ..... 257/686; 257/780; 257/783; 257/E23.169

(58) Field of Classification Search
USPC .................. 257/686, 723, 780, 783, E23.169
See application file for complete search history.

(56) References Cited

U.S. PATENT DOCUMENTS

| 6,335,565 | B1 * | 1/2002 | Miyamoto et al. | 257/686 |
| 6,798,057 | B2 * | 9/2004 | Bolkin et al. | 257/686 |
| 7,528,474 | B2 | 5/2009 | Lee | |
| 7,986,035 | B2 | 7/2011 | Miyagawa | |
| 8,017,448 | B2 | 9/2011 | Ino | |
| 8,409,923 | B2 | 4/2013 | Kim et al. | |
| 8,546,932 | B1 | 10/2013 | Chung | |
| 2005/0003587 | A1 | 1/2005 | Shiozawa | |
| 2005/0184377 | A1 * | 8/2005 | Takeuchi et al. | 257/686 |
| 2007/0290376 | A1 * | 12/2007 | Zhao et al. | 257/787 |
| 2010/0072600 | A1 * | 3/2010 | Gerber | 257/686 |
| 2010/0123235 | A1 | 5/2010 | Kim et al. | |
| 2010/0304530 | A1 | 12/2010 | Yim et al. | |
| 2011/0068481 | A1 | 3/2011 | Park et al. | |
| 2011/0140258 | A1 | 6/2011 | Do et al. | |
| 2011/0309893 | A1 | 12/2011 | Kawamura et al. | |
| 2012/0025398 | A1 | 2/2012 | Jang et al. | |
| 2012/0049338 | A1 | 3/2012 | Chen et al. | |
| 2012/0068319 | A1 | 3/2012 | Choi et al. | |
| 2012/0074586 | A1 | 3/2012 | Seo et al. | |
| 2012/0086003 | A1 | 4/2012 | Park | |
| 2012/0139090 | A1 | 6/2012 | Kim et al. | |
| 2012/0241950 | A1 * | 9/2012 | Takahashi | 257/737 |
| 2014/0273348 | A1 * | 9/2014 | Yim et al. | 438/107 |

FOREIGN PATENT DOCUMENTS

EP 2284880 2/2011
JP 20070012959 1/2007

OTHER PUBLICATIONS

International Search Report and Written Opinion from PCT/US2013/061316, dated Sep. 24, 2013, Apple Inc., pp. 1-17.
U.S. Appl. No. 13/586,375, filed Aug. 15, 2012, inventor Chung.

* cited by examiner

Primary Examiner — Nitin Parekh
(74) Attorney, Agent, or Firm — Gareth M. Sampson; Meyertons, Hood, Kivlin, Kowert & Goetzel, P.C.

(57) ABSTRACT

A PoP (package-on-package) package includes a bottom package coupled to a top package. Terminals on the top of the bottom package are coupled to terminals on the bottom of the top package with an electrically insulating material located between the upper surface of the bottom package and the lower surface of the top package. The bottom package and the top package are coupled during a process that applies force to bring the packages together while heating the packages.

13 Claims, 3 Drawing Sheets

POP STRUCTURE WITH ELECTRICALLY INSULATING MATERIAL BETWEEN PACKAGES

BACKGROUND

1. Field of the Invention

The present invention relates to semiconductor packaging and methods for packaging semiconductor devices. More particularly, the invention relates to a PoP (package-on-package) using electrically insulating material between the packages and thermal compression bonding to couple the packages.

2. Description of Related Art

Package-on-package ("PoP") technology has become increasingly popular as the demand for lower cost, higher performance, increased integrated circuit density, and increased package density continues in the semiconductor industry. As the push for smaller and smaller packages increases, the integration of die and package (e.g., "pre-stacking" or the integration of system on a chip ("SoC") technology with memory technology) allows for thinner packages. Such pre-stacking has become a critical component for thin and fine pitch PoP packages.

A problem that arises with thin and fine pitch PoP packages is the potential for warping as the pitch is reduced between terminals (e.g., balls such as solder balls) on either the top package or the bottom package in the PoP package. The warping problem in the PoP structure may be further increased with the use of thin or coreless substrates in the packages. The top package and the bottom package in a PoP structure may have different warpage behavior because of differences in the materials used and/or differences in their structures. The differences in warpage behavior may be caused by differences in the characteristics of materials used in the packages that cause the packages to expand/contract at different rates.

The differences in warpage behavior between the top and bottom packages may cause yield loss in the solder joints coupling the packages (e.g., the connections between solder balls on the top package and landing pads on the bottom package). A large fraction of PoP structures may be thrown away (rejected) because of stringent warpage specifications placed on the top and bottom packages. The rejected PoP structures contribute to low pre-stack yield, wasted materials, and increased manufacturing costs.

SUMMARY

In certain embodiments, a PoP package includes a bottom package and a top package. The bottom package may include a substrate with an encapsulant at least partially covering an upper surface of the substrate. A die may be coupled to the upper surface of the substrate. The top package may include a substrate with an encapsulant at least partially covering an upper surface of the substrate. One or more die may be coupled to the upper surface of the substrate and encapsulated in the encapsulant.

Terminals on the top of the bottom package substrate are coupled (e.g., connected) to terminals on the bottom of the top package substrate when the bottom package is coupled to the top package. An electrically insulating material is located between the upper surface of the bottom package and the lower surface of the top package. The electrically insulating material provides reinforcement between the bottom package and the top package by mechanically coupling or bonding the packages together and inhibits warping of the packages.

In certain embodiments, the bottom package and the top package are coupled using a thermal compression bonding process. The thermal compression bonding process applies a force bringing the packages together while heating the packages. During the thermal compression bonding process, the material of the terminals (e.g., solder) reflows and forms electrical connections between the terminals and the electrically insulating material cures. The electrically insulating material cures such that there are no air gaps between the upper surface of the bottom package and the lower surface of the top package.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1A:
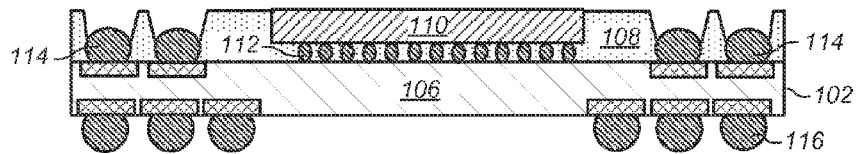
FIGS. 1A-D depict cross-sectional representations of steps of an example of a process flow for forming a PoP ("package-on-package") package.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

FIGS. 1A-D depict cross-sectional representations of steps of an example of a process flow for forming a PoP ("package-on-package") package. FIG. 1A depicts a cross-sectional representation of an embodiment of bottom package 102. Bottom package 102 includes substrate 106 with encapsulant 108 at least partially covering the substrate. Die 110 may be coupled (e.g., connected) to substrate 106 using terminals 112 (e.g., solder balls) and be at least partially covered in encapsulant 108. In some embodiments, die 110 is covered by encapsulant 108. In certain embodiments, die 110 is a processor or logic die, or die 110 is a system on a chip ("SoC"). Die 110 may be, for example, a semiconductor chip die such as a flip chip die.

Terminals 114 may be coupled to, or on, an upper (top) surface of substrate 106. Terminals 114 may be, for example, solder or tin (Sn)-coated landing pads. Terminals 116 (e.g., solder balls) may be coupled to, or on, a lower (bottom) surface of substrate 106. Terminals 116 may be used to couple substrate 106 and package 100 to a motherboard or a printed circuit board (PCB).

Figure 1B:
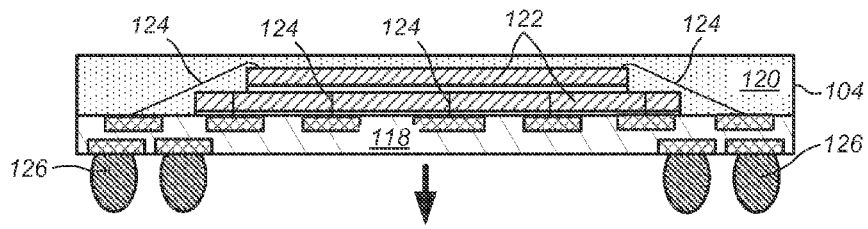

FIG. 1B depicts a cross-sectional representation of an embodiment of top package 104 being brought towards bottom package 102. Top package 104 includes substrate 118 with encapsulant 120 covering an upper (top) surface of the substrate. In certain embodiments, one or more die 122 are coupled to substrate 118 and enclosed in encapsulant 120. Die 122 may be coupled (e.g., connected) to substrate 118 using, for example, one or more wire bonds 124. Die 122 may be, for example, semiconductor chips such as wire-bond die or flip chip die. In certain embodiments, die 122 are memory die.

Terminals 126 are coupled to a lower (bottom) surface of substrate 106. Terminals 126 may be, for example, solder balls. As shown in FIG. 1B, terminals 126 on top package 104 are aligned with corresponding terminals 114 on bottom package 102 as the packages are brought together.

Figure 1C:
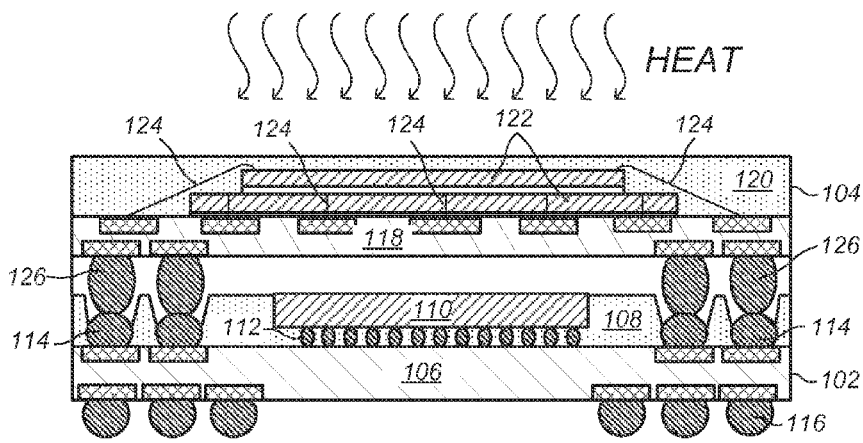

FIG. 1C depicts a cross-sectional representation of an embodiment of bottom package 102 coupled to top package 104 with terminals 114 in contact with terminals 126. Heat may be applied to top package 104 and bottom package 102 after terminals 126 are brought into contact with terminals 114. Heat may be applied, for example, using a solder reflow oven (e.g., the packages are placed in the solder reflow oven and heated). The packages may be heated to a temperature that melts (solder reflow) the materials in terminals 114 and terminals 126 (e.g., solder melting temperatures). Solder flux may be applied between terminals 126 and 114 during the solder reflow process. Typically, the packages are heated to a temperature between about 220° C. and about 260° C. (e.g., about 240° C.).

Figure 1D:
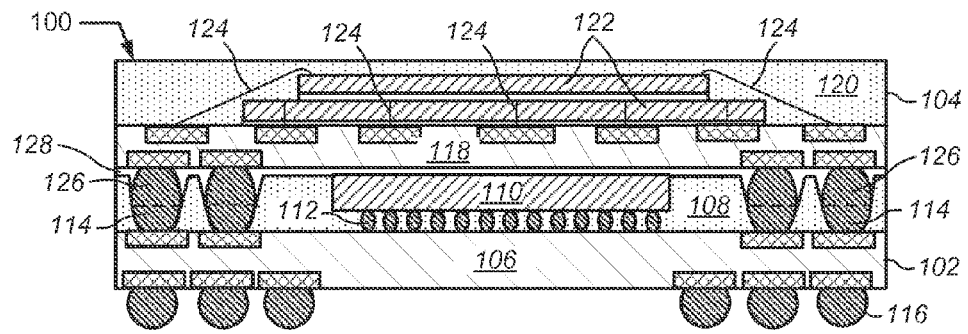

The applied heat melts the solder and evaporates solder flux to form PoP package 100. PoP package 100 is then cooled down to ambient temperature. FIG. 1D depicts a cross-sectional representation of an embodiment of PoP package 100 following cooling to ambient temperature. PoP package 100 includes bottom package 102 and top package 104 coupled through terminals 114 and terminals 126. The dashed lines between terminals 114 and terminals 126 are shown for clarity between the terminals depicted in FIG. 1D. Terminals 114 and terminals 126, however, are made with materials that will substantially intermix after melting and form intermixed junctions between top package 104 and bottom package 102.

As shown in FIG. 1D, PoP package 100 includes air gap 128 between top package 104 and bottom package 102. While top package 104 and bottom package 102 move closer to each other when the materials in terminals 114 and terminals 126 melt, air gap 128 remains between the packages, especially between top substrate 118 and bottom die 110, as shown in FIG. 1D.

As shown in FIGS. 1A-1D, bottom package 102 and top package 104 may include different materials and/or different structures. Thus, bottom package 102 and top package 104 may have differing characteristics (e.g., coefficient of thermal expansion ("CTE") and/or shrinkage rate). Differing thermal expansion characteristics may produce different warpage behavior in bottom package 102 and top package 104 during use of the PoP package. These differences in warpage behavior between bottom package 102 and top package 104 may cause disconnection between opposing solder joints (e.g., disconnection between corresponding terminals 126 and 114 in FIG. 1D) and/or bridging between adjacent solder joints (e.g., bridging between adjacent terminals 126 or adjacent terminals 114 in FIG. 1D) during the pre-stacking (the forming of the PoP) solder reflow process. These problems may lead to yield loss during the pre-stacking process.

Extreme warpage behavior may also cause reliability issues over time. For example, the connections solder joints of 114/126 may fail after repeated heating/cooling cycles of PoP package 100. The warpage problems in bottom package 102 and top package 104 may be increased if substrate 106 and/or substrate 118 are relatively thin substrates (e.g., less than about 400 μm in thickness) and/or the substrates are coreless substrates (e.g., a substrate made of only dielectric polymer and copper traces). Thus, strict warpage control specifications are placed on top package 102 and bottom package 104 to avoid yield loss of the PoP pre-stacking. In addition to the strict warpage specifications of the top and bottom packages of the PoP, a strict warpage specification for the overall PoP package 100 (after PoP formation) is also required to ensure the PoP can be soldered onto a motherboard or a system printed circuit board. Because of these strict warpage specifications, many packages including top packages 104, bottom package 102, and PoP packages 100 may be rejected with the rejection of these packages leading to low pre-stack and assembly yield, and increased manufacturing costs.

Figure 2A:
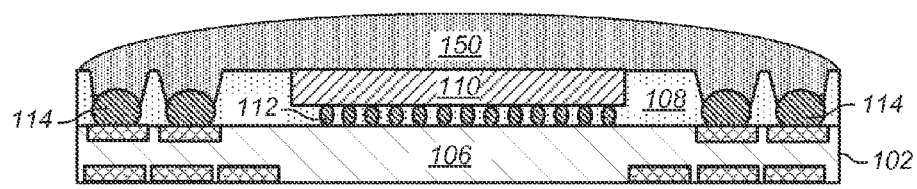
FIGS. 2A-D depict cross-sectional representations of an embodiment of a process flow for forming a PoP package.

FIGS. 2A-D depict cross-sectional representations of an embodiment of a process flow for forming a PoP package. FIG. 2A depicts a cross-sectional representation of an embodiment of bottom package 102 with electrically insulating material 150 dispensed (deposited) onto the upper surface of the bottom package. Bottom package 102, as described above, may include substrate 106 with encapsulant 108 at least partially covering the substrate and die 110 coupled to the substrate using terminals 112. Terminals 114 are coupled to, or on, the upper (top) surface of substrate 106. Terminals 114 may be landing pads for terminals from a top package. For example, terminals 114 may be solder-coated or Sn-coated landing pads.

In some embodiments, bottom package 102 is pre-heated before material 150 is deposited on the upper surface of the bottom package. For example, bottom package 102 may be pre-heated to a temperature of about 150° C. In some embodiments, bottom package 102 is heated after material 150 is deposited on the upper surface of the bottom package.

As shown in FIG. 2A, electrically insulating material 150 substantially covers terminals 114, die 110, and encapsulant 108 on bottom package 102. Material 150 may be, for example, a polymer or epoxy material such as an underfill material or a non-conductive paste. For example, material 150 may be an underfill material used in flip-chip bonding processes such as a snap cure underfill material or a low profile underfill material. Typically, material 150 is an electrically insulating material that cures at or lower than the melting temperatures of the materials used in terminals 114 and terminals 126 (e.g., the solder melting temperature).

Figure 2B:
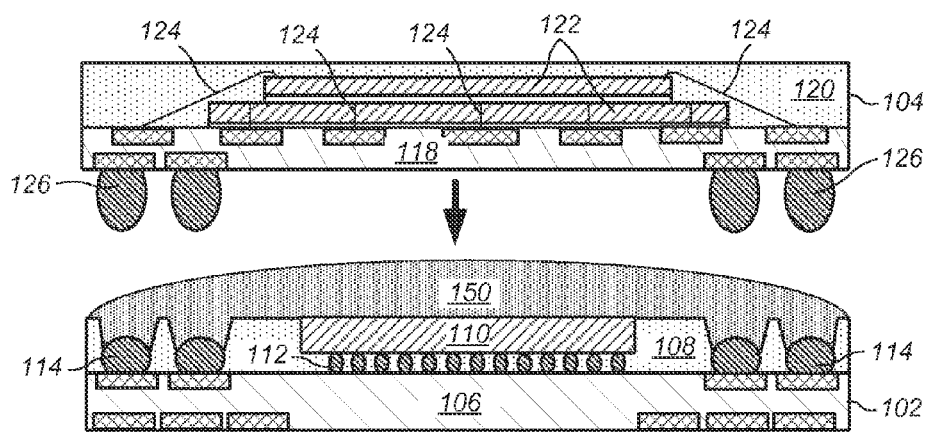

After electrically insulating material 150 is dispensed on bottom package 102, top package 104 is brought towards the bottom package, as shown in FIG. 2B. Top package 104, as described above, may include substrate 118 with encapsulant 120 covering an upper (top) surface of the substrate and one or more die 122 coupled to the substrate and enclosed in the encapsulant. Terminals 126 are coupled to the lower (bottom) surface of substrate 116. Terminals 126 may be, for example, solder balls or copper (Cu) pillars.

In some embodiments, top package 104 is pre-heated before being coupled to bottom package 102. For example, top package 104 may be pre-heated to a temperature of about 150° C. In some embodiments, top package 104 is pre-heated after being coupled to bottom package 102 (e.g., the packages are pre-heated together).

As shown in FIG. 2B, terminals 126 on top package 104 are aligned with corresponding terminals 114 on bottom package 102 as the packages are brought together. As top package 104 is brought closer to bottom package 102, electrically insulating material 150 is distributed in the space between the top package and the bottom package and around terminals 114 and terminals 126. In some embodiments, electrically insulating material 150 is deposited on the lower surface of top package 104 instead of (or in addition to) the upper surface of bottom package 102 before bringing the packages together.

Figure 2C:
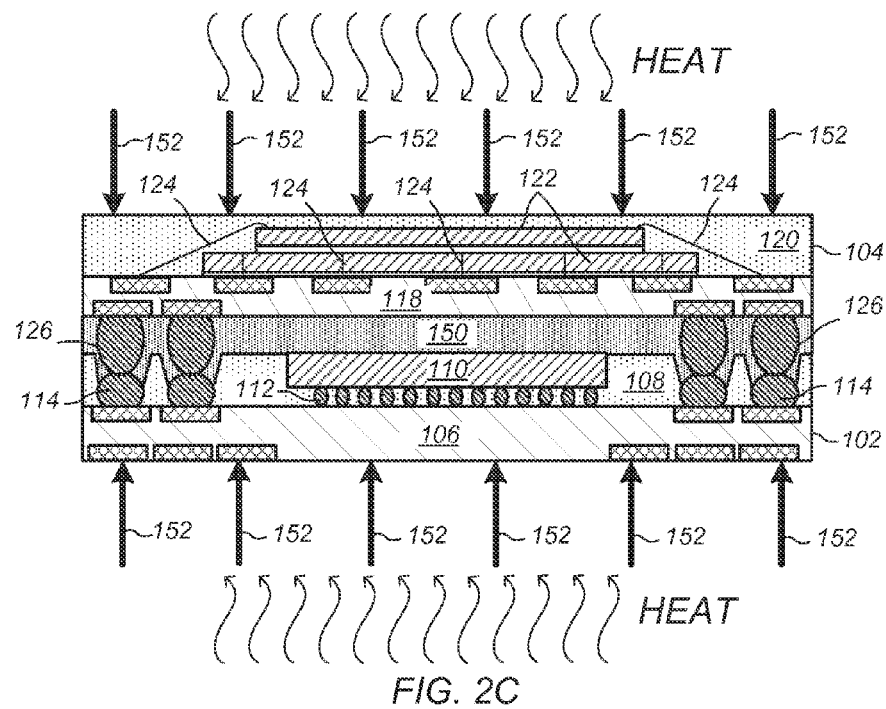

FIG. 2C depicts a cross-sectional representation of an embodiment of bottom package 102 coupled to top package 104 with terminals 114 in contact with terminals 126 and electrically insulating material 150 distributed in the space between the packages. In certain embodiments, after terminals 126 are brought into contact with terminals 114, force is applied to top package 104 towards bottom package 102 (as shown by arrows 152) to bring the packages closer together. Force may also be applied to bottom package 104 to bring the packages closer together (as shown by arrows 152). In some embodiments, the force applied to bottom package 104 is used to counter-balance, or provide support against, the force applied to top package 102.

Heat may be applied to both bottom package 102 and top package 104 while the force is applied to bring the packages together. In certain embodiments, the force and the heat are applied to the packages substantially simultaneously (e.g., the force and the heat are applied in a thermal compression bonding process to bond the packages together). The combination of the applied force and the applied heat distributes electrically insulating material 150 in the space between the packages and causes the reflow of the materials in terminals 114 and terminals 126 (e.g., solder reflow). When terminals 126 are Cu pillars, terminals 114 that are solder may reflow during the thermal compression bonding process and form electrical connection to terminals 126.

The force and the heat may be applied using apparatus such as a thermal compression bonding apparatus (e.g., a flip-chip thermal compression bonding apparatus). An example of a flip-chip thermal compression bonding apparatus is an FC3000 Flip Chip Bonder available from Toray Engineering Co., Ltd. (Tokyo, Japan). In some embodiments, the apparatus used for thermal compression bonding may also be useable to pick up and place top package 104 onto bottom package 102 (with terminals 126 and terminals 114 aligned) before thermal compression bonding of the packages.

In certain embodiments, the amount of force applied to bring the packages together is between about 5 N (newtons) and about 500 N. In certain embodiments, the force is applied while the packages are heated to a temperature that melts the materials in terminals 114 and/or terminals 126 (e.g., solder melting temperatures). In some embodiments, the packages are heated to a temperature above about 220° C., above about 240° C., or above about 260° C. Typically, the packages are heated to a temperature just above the melting point of the materials of terminals 114 and terminals 126. The amount of force applied to the packages and the package heating temperature may vary depending on the materials used for terminals 114 and terminals 126, the material of electrically insulating material 150, and/or other materials used in bottom package 102 or top package 104.

In certain embodiments, electrically insulating material 150 includes solder flux as an ingredient when placed on bottom package 102 and/or top package 104. Thus, material 150 allows reflow of solder (e.g., the materials of terminals 114 and/or terminals 126) during thermal compression bonding of bottom package 102 and top package 104, as described above. Material 150 may cure during thermal compression bonding of bottom package 102 and top package 104. In some embodiments, bottom package 102 and top package 104 are subjected to a postcure heating process to fully cure electrically insulating material 150. For example, if the thermal compression bonding process does not fully cure electrically insulating material 150, bottom package 102 and top package 104 may be further heated to fully cure the electrically insulating material.

In certain embodiments, the thermal compression bonding of bottom package 102 and top package 104 takes place on the order of a few seconds (e.g., between about 1 and 10 seconds). The material in terminals 114 and terminals 126 may reflow (e.g., solder reflow) within a few seconds when subjected to the bonding force (the applied force described above) and heating to melting temperatures simultaneously. Material 150 may rapidly cure (e.g., within a few seconds) during thermal compression bonding of bottom package 102 and top package 104. The rapid curing of material 150 and the short time needed for solder reflow allows for short process times using the thermal compression bonding process. The time needed for the thermal compression bonding of bottom package 102 and top package 104 may vary based on factors such as, but not limited to, the amount of time needed for melting of materials in terminals 114 and/or terminals 126 and the amount of time needed for curing of electrically insulating material 150. The short process time for the thermal compression bonding of bottom package 102 and top package 104 improves throughput for pre-stacking the packages.

Figure 2D:
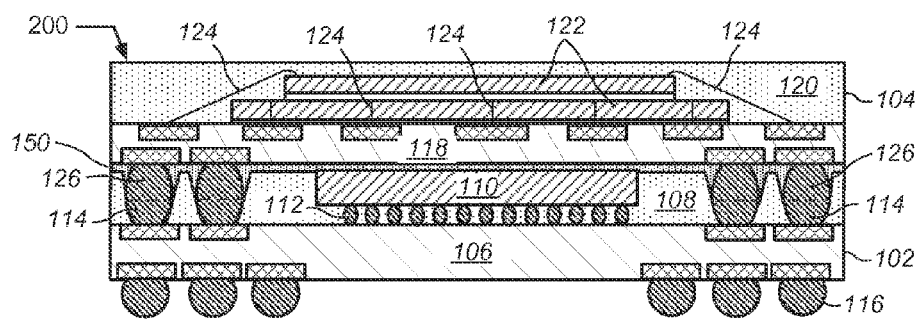

After the thermal compression bonding step (or optional postcuring process), bottom package 102 and top package 104 are allowed to cool to ambient temperature to form a PoP package (e.g., complete a pre-stacking process). FIG. 2D depicts a cross-sectional representation of an embodiment of PoP package 200 following cooling of bottom package 102 and top package 104 with electrically insulating material 150 cured between the packages. PoP package 200 includes bottom package 102 and top package 104 coupled through terminals 114 and terminals 126. The dashed lines between terminals 114 and terminals 126 are shown for clarity between the terminals depicted in FIG. 2D.

Terminals 116 (e.g., solder balls) may be coupled to, or on, a lower (bottom) surface of substrate 106 after the thermal compression bonding process is completed. For example, PoP package 200 may be flipped over and terminals 116 coupled to the bottom surface of substrate 106 using solder reflow processing. Placing terminals 116 on PoP package 200 after thermal compression bonding allows force or support to be provided to bottom package 102 (as shown in FIG. 2C) to counter-balance the force on top package 102 during the thermal compression bonding process. Terminals 116 may be coupled to substrate 106 in an individual process (for a single PoP package) or in a batch process with multiple PoP packages in a package substrate strip. Terminals 116 may be used to couple substrate 106 and package 200 to a motherboard or a system printed circuit board (PCB). In some embodiments, substrate 106 is coupled to the motherboard or the system PCB using a land grid array (LGA) process, which does not require terminals 116 to be solder balls.

As shown in FIG. 2D, PoP package 200 includes cured electrically insulating material 150 between top package 104 and bottom package 102. During the thermal compression bonding process, material 150 flows and substantially fills the space between the upper surface of bottom package 102 and the lower surface of top package 104. Thus, after electrically insulating material 150 cures following the thermal compression bonding process, the electrically insulating material fills the space between the upper surface of bottom package 102 and the lower surface of top package 104 with substantially no air gaps between the surfaces of the packages. In certain embodiments, electrically insulating material 150 mechanically couples or bonds bottom package 102 to top package 104.

In certain embodiments, electrically insulating material 150 provides reinforcement between bottom package 102 and top package 104 and reinforces PoP package 200. For example, electrically insulating material 150 may reinforce bottom package 102 and top package 104 by mechanically coupling or bonding the packages together. The reinforcement provided by electrically insulating material 150 makes PoP package 200 stiffer and reduces or eliminates warpage during the reflow of soldering the PoP package on to the motherboard or the system PCB. Electrically insulating material 150 may also improve the fatigue lifetime of solder joints in PoP package 200 (e.g., terminals 114/126 in FIG. 2D).

Bottom package 102 and top package 104 may be flattened at the bonding temperature because of the use of compression force during the thermal compressing bonding process. This flattening of bottom package 102 and top package 104 may greatly relax the warpage specifications of both the bottom and top packages. Relaxation of the warpage specifications may reduce the number of rejected top and bottom packages, increase the pre-stacked yield, and lower manufacturing costs. In addition, using thermal compression bonding and electrically insulating material 150 during formation of PoP package 200 (shown in FIG. 2D) provides better co-planarity in the PoP package at both ambient (room temperature) and at higher temperatures than PoP package 100 (shown in FIG. 1D). The better co-planarity in PoP package 200 may reduce the yield loss when coupling the PoP package to a motherboard and provide a higher yield at board level assembly (e.g., when attaching multiple packages to the motherboard).

The use of thermal compression bonding and electrically insulating material 150 in the process flow for forming PoP package 200 depicted in FIGS. 2A-D also eliminates the need for using a reflow oven for solder reflow processing. Removing the reflow oven may reduce manufacturing costs for PoP package 200 as compared to other PoP packages as reflow ovens may be high cost equipment.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A semiconductor device package assembly, comprising:
a top package comprising one or more first terminals on a lower surface of the top package;
a bottom package, the bottom package having a substrate with an encapsulant at least partially covering the upper surface, comprising one or more second terminals on an upper surface of the bottom package, wherein the second terminals comprise solder, and wherein the second terminals are coupled to corresponding first terminals on the top package; and
a cured electrically insulating material located between the lower surface of the top package and the upper surface of the bottom package, wherein the electrically insulating material has a curing temperature that is at or lower than a melting temperature of the solder in the second terminals.

2. The assembly of claim 1, wherein the electrically insulating material has been cured at a temperature of at least about 220° C.

3. The assembly of claim 1, wherein the electrically insulating material comprises non-conductive paste or underfill material.

4. The assembly of claim 1, wherein the electrically insulating material substantially fills space between the upper surface of the bottom package and lower surface of the top package such that there are substantially no air gaps between the surfaces of the packages.

5. The assembly of claim 1, wherein the electrically insulating material mechanically couples the top package to the bottom package.

6. A semiconductor device package assembly, comprising:
a first substrate with an encapsulant at least partially covering an upper surface of the first substrate;
one or more first terminals coupled to the upper surface of the first substrate;
a die coupled to the upper surface of the first substrate, wherein the die is at least partially encapsulated in the encapsulant;
a second substrate;
one or more second terminals comprising solder, coupled to a lower surface of the second substrate;
wherein at least some of the first terminals on the first substrate are coupled to corresponding second terminals on the second substrate to couple the substrates with a space between the substrates; and
a cured electrically insulating material substantially filling the space between the substrates such that there are substantially no air gaps between the surfaces of the packages, wherein the electrically insulating material has a curing temperature that is at or lower than a melting temperature of the solder in the second terminals.

7. The assembly of claim 6, wherein the electrically insulating material at least partially covers an upper surface of the encapsulant.

8. The assembly of claim 6, wherein the lower surface of the second substrate is coupled to the upper surface of the first substrate with the electrically insulating material between the substrates by applying force to bring the first substrate towards the second substrate while heating the substrates and the electrically insulating material to a temperature of at least about 220° C.

9. The assembly of claim 6, wherein the die comprises a processor die.

10. The assembly of claim 6, wherein the electrically insulating material bonds the first substrate to the second substrate.

11. A semiconductor device package assembly system, comprising:
a bottom package configured to be coupled to a top package;
the bottom package comprising:
a first substrate with an encapsulant at least partially covering an upper surface of the first substrate;
one or more first terminals coupled to the upper surface of the first substrate, wherein the first terminals comprise solder;
a die coupled to the upper surface of the first substrate, wherein the die is at least partially encapsulated in the encapsulant; and
a cured, electrically insulating material at least partially covering the upper surface of the first substrate and the encapsulant, wherein the electrically insulating material has a curing temperature that is at or lower tan a melting temperature of the solder in the first terminals;

the top package comprising:
a second substrate; and
one or more second terminals coupled to a lower surface of the second substrate, wherein at least some of the second terminals are configured to be coupled to corresponding first terminals on the first substrate.

12. The system of claim 11, wherein the top package and the bottom package are configured to be coupled with a space between the first substrate and the second substrate, and wherein the electrically insulating material substantially fills the space between the substrates such that there are substantially no air gaps between the surfaces of the packages.

13. The system of claim 11, wherein the electrically insulating material has been cured at a temperature of at least about 220° C.

\* \* \* \* \*

UNITED STATES PATENT AND TRADEMARK OFFICE
CERTIFICATE OF CORRECTION

PATENT NO. : 8,963,311 B2  
APPLICATION NO. : 13/627905  
DATED : February 24, 2015  
INVENTOR(S) : Jie-Hua Zhao et al.

Page 1 of 1

It is certified that error appears in the above-identified patent and that said Letters Patent is hereby corrected as shown below:

In the Claims:

Claim 11, Column 8, Line 65, please delete "tan" and substitute -- than --

Signed and Sealed this  
Thirtieth Day of June, 2015

Michelle K. Lee  
*Director of the United States Patent and Trademark Office*